United States Patent
Yalamarthy et al.

(10) Patent No.: US 11,035,912 B2
(45) Date of Patent: Jun. 15, 2021

(54) NO-SWITCHING AC MAGNETIC HALL-EFFECT MEASUREMENT METHOD

(71) Applicant: The Board of Trustees of the Leland Stanford Junior University, Stanford, CA (US)

(72) Inventors: Ananth Saran Yalamarthy, Mountain View, CA (US); Anand Vikas Lalwani, Stanford, CA (US); Hannah Alpert, Stanford, CA (US); Maximillian Holliday, Santa Fe, NM (US); Saleh Kargarrazi, Pittsburgh, PA (US); Debbie Senesky, Piedmont, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/865,282

(22) Filed: May 1, 2020

(65) Prior Publication Data
US 2020/0348372 A1    Nov. 5, 2020

Related U.S. Application Data

(60) Provisional application No. 62/843,016, filed on May 3, 2019.

(51) Int. Cl.
*G01R 33/07* (2006.01)
(52) U.S. Cl.
CPC .................................. *G01R 33/07* (2013.01)

(58) Field of Classification Search
CPC . G01R 33/0029; G01R 33/285; G01R 33/287
See application file for complete search history.

(56) References Cited

U.S. PATENT DOCUMENTS

| | | | |
|---|---|---|---|
| 3,223,924 A | 12/1965 | Wieder | |
| 3,546,578 A | 12/1970 | Sisson | |
| 6,501,268 B1* | 12/2002 | Edelstein | G01R 33/02 324/225 |
| 7,923,996 B2 | 4/2011 | Doogue | |
| 8,564,285 B2* | 10/2013 | Romero | G01R 33/07 324/251 |
| 2013/0278252 A1 | 10/2013 | Sasaki | |
| 2014/0333295 A1* | 11/2014 | Fernandez | G01B 7/003 324/207.12 |
| 2018/0234041 A1* | 8/2018 | Sun | H02P 6/30 |

OTHER PUBLICATIONS

Lindemuth, "An Introduction to AC Field Hall Effect Measurements", undated, Lakeshore Cryotronics application note.

* cited by examiner

*Primary Examiner* — Alvaro E Fortich
(74) *Attorney, Agent, or Firm* — Lumen Patent Firm

(57) ABSTRACT

We provide a Hall effect sensor driven with an AC current where the output Hall signal component is at the second harmonic. More specifically, the drive current is at $f_A$ and the relevant Hall signal frequency component is at $2f_A$. The resulting measurement is of the magnetic field strength at $f_A$. This eliminates the need for switching to suppress the parasitic offset signal. This approach also leads to suppression of the induced signal caused in the Hall sensor by the time varying magnetic field.

9 Claims, 6 Drawing Sheets

NO-SWITCHING AC MAGNETIC HALL-EFFECT MEASUREMENT METHOD

CROSS REFERENCE TO RELATED APPLICATIONS

This application claims the benefit of U.S. Provisional Patent Application 62/843,016 filed May 3, 2019, which is incorporated herein by reference.

FIELD OF THE INVENTION

This invention relates to Hall effect sensors for time-varying magnetic fields.

BACKGROUND

AC magnetic field measurements using currently available Hall effect sensors require complex switching circuitry to mitigate the offset present in measurements. The added set of transistors for switching have fundamental limits as to which frequency they can measure and they also take up valuable space on small boards/chips. Furthermore, a time varying magnetic field can also create an induced signal in Hall effect sensors. Accordingly, it would be an advance in the art to provide improved suppression of the parasitic offset and induced signals in Hall effect measurements.

SUMMARY

We provide a Hall effect sensor driven with an AC current where the output Hall signal component is at the second harmonic. More specifically, the drive current is at $f_A$ and the relevant Hall signal frequency component is at $2f_A$. The resulting measurement is of the magnetic field strength at $f_A$. This eliminates the need for switching to suppress the parasitic offset signal. This approach also leads to suppression of the induced signal caused in the Hall sensor by the time varying magnetic field.

In cases where the magnetic field's frequency is not known, a solution is to sweep the frequencies of the AC current and using a voltage-peak hold module, record the highest Hall voltage. This voltage is expected to be at the second harmonic and will not have the offset.

Applications include but are not limited to measuring AC magnetic fields, such as the inside of a car engine or jet engine where the AC magnetic field is generated by a rotating motor/turbine or inside nuclear fusion reactors where dynamically changing magnetic fields exist.

Significant advantages are provided. We can potentially measure higher frequencies because frequency is not limited by the switching circuits needed in conventional approaches to mitigate offset. Systems according to these principles can be put in a smaller package overall which advantageously reduces size and component count, thereby also reducing cost. We can measure an unknown steady frequency and back calculate the frequency of the magnetic field. We can also provide a spectrum analysis capability for a magnetic field having arbitrary spectral content.

DETAILED DESCRIPTION

Section A describes general principles relating to embodiments of the invention. Section B is a detailed description of some exemplary embodiments.

A) General Principles

Figure 1:
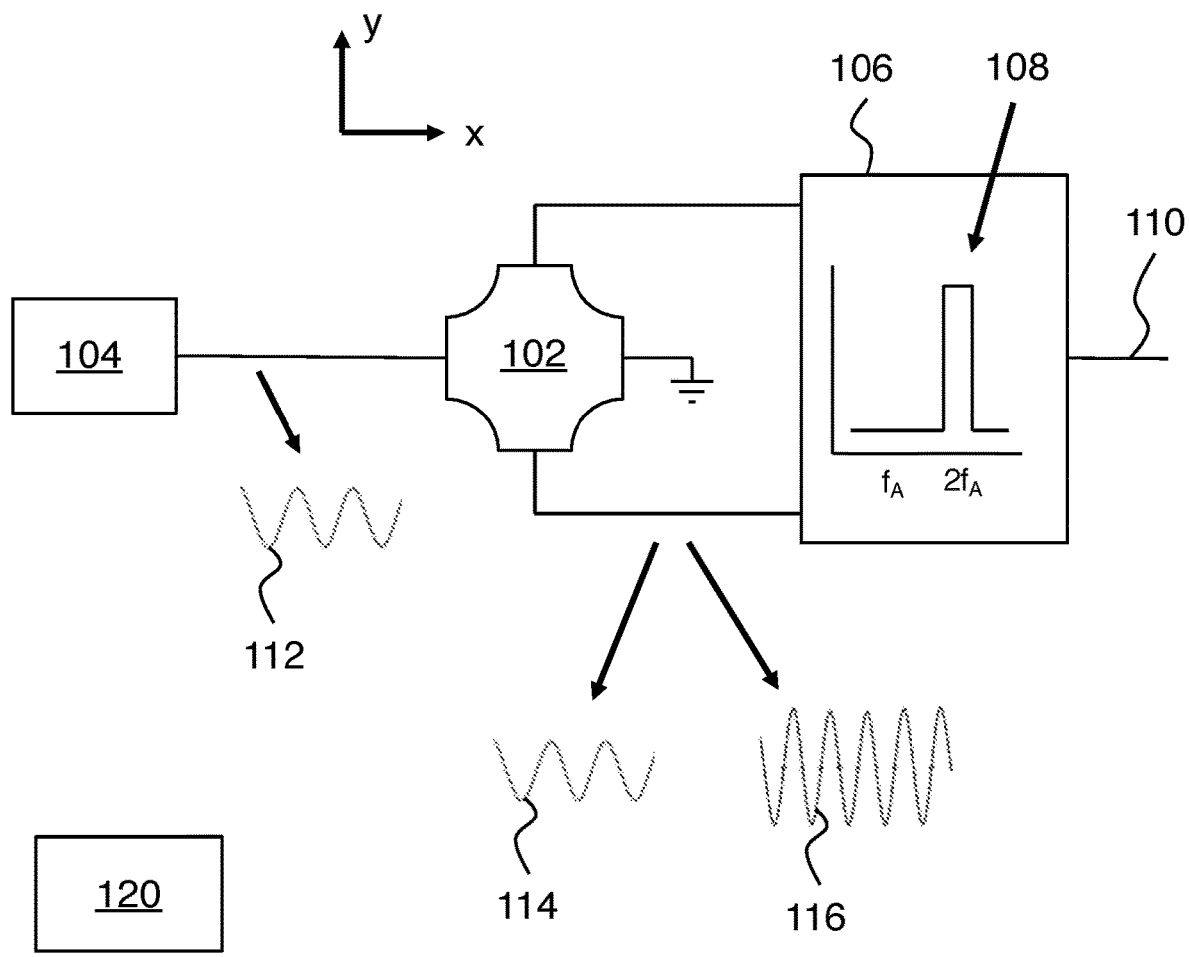
FIG. 1 shows an exemplary embodiment of the invention.

FIG. 1 shows an exemplary embodiment of the invention, which is an apparatus for performing a Hall effect measurement of a time-varying magnetic field. This example includes a Hall effect sensor 102 and an electrical source 104 configured to drive applied current through the Hall effect sensor. In this example, the applied current is shown as flowing from source 104 to ground through Hall effect sensor 102 in the x direction, and the frequency of this applied current is $f_A$. Source 104 can be a current source or it can be a voltage source appropriately configured to provide the applied current to Hall effect sensor 102. We assume the magnetic field is in the z direction on this figure.

In this example, the Hall voltage is measured between points in Hall effect sensor 102 that are separated in the y direction as shown, and there are several contributions to this Hall voltage. More specifically, Hall effect sensor 102 provides a first signal proportional to a product of applied current and the time-varying magnetic field. This first signal is the useful Hall signal. Hall effect sensor 102 also provides a second signal proportional to the applied current and independent of the time-varying magnetic field. This second signal is an undesirable parasitic signal, and is usually referred to as the offset signal. In practice, Hall effect sensor 102 usually also provides a third signal proportional to a time derivative of the time-varying magnetic field and independent of the applied current. This third signal is also an undesirable parasitic signal, and is usually referred to as the induced signal.

As described in greater detail below, the frequencies of the second and third signals differ from the frequency of the first signal for time-varying magnetic fields. One simple example of this is where the magnetic field has a single, known frequency $f_B$. By setting $f_A = f_B$, the resulting frequencies of the first, second and third signals are $2f_A$, $f_A$, and $f_A$, respectively.

The output of Hall effect sensor 102 is connected to a narrowband electrical detector 106. Detector 106 is configured to provide an output Hall effect signal 110 of the apparatus at $2f_A$, and the detector is preferentially responsive at $2f_A$ relative to $f_A$. One way to implement this capability is for detector 106 to include a bandpass filter centered on $2f_A$ where $f_A$ is in a stop band of the filter, as schematically shown by frequency response 108 on FIG. 1. Detector 106 would typically also include an amplifier. The functions of detector 106 can be implemented in analog circuitry or digital processing or any combination of analog circuitry and digital processing. Lock-in detection at $2f_A$ is another option for narrowband electrical detector 106.

The result of this scheme is that the output Hall effect signal 110 at $2f_A$ of the apparatus has improved magnetic field sensing accuracy due to suppression of the second (offset) and third (induced) signals. Here 112 schematically shows applied current at frequency $f_A$, 114 is the offset+ induced signal (also at frequency $f_A$) and 116 is the Hall effect signal (at $2f_A$). The main purpose of detector 106 is to amplify 116 and suppress 114.

Various applications are possible, including but not limited to measuring magnetic fields in: automotive engines, airplane engines, fusion reactors, electrical power plants, electric motors and power electronics Hall effect sensing according to these principles can be carried out in several different configurations. The simplest configuration is where the time-varying magnetic field is at a single known frequency $f_B$. Here the measurement proceeds by setting $f_A = f_B$ and looking for the Hall effect signal at $2f_A$, as in the example above.

A second configuration is where the time-varying magnetic field is at a single unknown frequency. Here the measurement can proceed by including a processor 120 on FIG. 1 that is configured to sweep $f_A$ within a predetermined frequency range and to automatically identify a frequency value f* of the applied current in the predetermined frequency range having a maximal output Hall effect signal at 2f*. The single unknown frequency of the magnetic field is measured to be f* in this situation, and the Hall signal at 2f* is a measure of the field strength. In cases like this where a frequency sweep of the applied current is performed, the bandpass response 108 of detector 106 is correspondingly swept in order to ensure proper rejection of offset and induced signals at all frequencies. Such tuning of the passband center frequency of a bandpass filter is well known in the art, and therefore is not described in detail here.

A third configuration is where the time-varying magnetic field is at two or more unknown frequencies (this includes the situation where the magnetic field has spectral content in one or more frequency ranges). Here processor 120 is configured to sweep $f_A$ within a predetermined frequency range and to provide an output measured magnetic field spectrum $B(f_A)$ given by the output Hall effect signal at $2f_A$. Here also, the bandpass response 108 of detector 106 is correspondingly swept in order to ensure proper rejection of offset and induced signals at all frequencies.

The apparatus can be configured to provide magnetic field monitoring in various ways. For any of the three configurations, processor 120 can be configured to monitor the output Hall effect signal at $2f_A$ of the apparatus for changes in magnetic field strength. In the second configuration, processor 120 can be configured to monitor the frequency value f* for changes in magnetic field frequency. In the third configuration, processor 120 can be configured to monitor the output measured magnetic field spectrum $B(f_A)$ for changes in magnetic field frequency.

B) Detailed Example

B1) Introduction

With the growth in Internet of Things (IoT) devices, electric vehicles, and power sensing units, the need to measure AC magnetic fields has increased. Hall effect sensors are used to measure changes in the magnetic field in a variety of applications, including electricity generation at power stations, electric motors, and sensors for power electronics. The wide diversity of applications of Hall effect sensors has driven significant research on device geometry, noise reduction, spinning methodology, and driving circuitry, with the primary goals of reducing noise, improving accuracy, and reducing costs of Hall effect sensors.

In Hall effect sensors, the minimum detectable magnetic flux density depends on the voltage that appears at the plate output contacts when the magnetic field is zero. This voltage is called the offset voltage. A typical Hall effect plate will always show a non-zero offset voltage because of resistance gradients, geometrical asymmetries arising from manufacturing tolerances, thermal gradients or even piezoresistive effects. One of the most significant advances in Hall effect sensor accuracy was the current-spinning method to eliminate voltage offset. In this method, the spinning circuitry switches the direction of the current flowing through the Hall effect sensor from one pair of contacts to another, thereby effectively cancelling most of the offset. However, a small offset, the residual offset, is still present after current spinning and is typically between hundreds of µT to tens of nT.

However, many applications require Hall effect sensors to operate in AC magnetic fields, which poses challenges for current-spinning.

In a rapidly oscillating magnetic field, the spinning circuitry must switch faster than the magnetic field for offset cancellation. In the literature, the fastest spinning circuit Hall effect devices are generally limited to 250 kHz and the few cases in literature that have higher bandwidth rely on current transformers or coils, thereby adding to the overall cost of the system. In addition, the capacitance of the switches utilized in the spinning circuitry limits the bandwidth. As such, there is a demonstrated need for small, low cost, large bandwidth Hall effect sensors that measure in the MHz range for power electronics and MRI (Magnetic Resonance Imaging) systems.

Another difficulty with measuring AC magnetic fields is the induced voltage. As the output of a Hall effect sensor is the voltage across two terminals ($V_H$), in the presence of a changing magnetic field, the Hall effect sensor has an induced voltage due to Lenz's law. It is useful to note that the induced voltage is at the same frequency as the magnetic field being measured and the voltage offset is at DC.

The techniques described in this work are general for all Hall effect sensors. In the experiments described below, an indium aluminum nitride on gallium nitride (InAlN/GaN) Hall effect sensor is used. For DC magnetic fields, the Hall effect voltage is:

$$V_H = \frac{I(B + \alpha)}{qn_s} \quad (1)$$

where $V_H$ is the Hall effect voltage, I is the current driving the Hall effect sensor, B is the external magnetic field, α is the offset, q is the electron charge constant and $n_s$ is the sheet density of electrons in the two dimensional electron gas (2 DEG).

In addition, for magnetic fields oscillating at frequency f, there is an added term for the induced magnetic field leading to an induced voltage due to Lenz's Law as shown in (2) and (3)

$$B = B_o \sin(2\pi f t) \quad (2)$$

$$V_H = \frac{I(B_o \sin(2\pi f t) + \alpha)}{qn_s} + \beta \frac{dB}{dt} \quad (3)$$

where $B_o$ is the magnetic field magnitude. This induced voltage term is proportional to the inductance of the sample and we denoted β as the appropriate constant of proportionality.

To eliminate the induced voltage, a commonly used method is the dual Hall effect plate technique. This method relies on two Hall effect sensors in operation. The first Hall effect sensor is driven at a static current, and current-spinning is applied. The second Hall effect sensor captures the induced voltage, $$\beta \frac{dB}{dt},$$

by operating at zero current. Then, the induced voltage is subtracted from the signal of the first Hall effect sensor.

Other techniques to measure AC magnetic fields, such as current transformers, are often cost-prohibitive and size-prohibitive for wide-scale implementation. There is a clear need for small, cost-effective AC magnetic field sensors. Here, we describe a new technique that enables a single Hall effect sensor to measure high-frequency magnetic fields with low offset voltage and no induced voltage.

B2) The 2f Method for Zero Induced Voltage

We describe a technique in which an AC current is applied to the Hall effect sensor at the same frequency as the magnetic field being measured. The generated signal is then measured at double the frequency ($2f_A$) of the input current, resulting in a signal of just the magnetic field magnitude with no induced AC voltage (Lenz's law) or offset. A schematic representation of the method is shown in FIG. 1.

Using the oscillating signals, the AC magnetic field (B) and driving AC current (I) can be written as $$I = I_o \sin(2\pi f_A t) \quad (4a)$$

$$B = B_o \sin(2\pi f_A t) \quad (4b)$$

where the frequency $f_A$ of the two signals is the same. Substituting these terms into (1), the resulting Hall voltage is:

$$V_H = \frac{I_o \sin(2\pi f_A t)(B_o \sin(2\pi f_A t) + \alpha)}{q n_s} + \beta \frac{dB}{dt} = \quad (5)$$

$$\frac{I_o B_o \sin^2(2\pi f_A t)}{q n_s} \frac{I_o \alpha \sin(2\pi f_A t)}{q n_s} + 2\pi f_A \beta B_o \cos(2\pi f_A t) =$$

$$\frac{-I_o B_o \cos(4\pi f_A t)}{2 q n_s} + \frac{I_o \alpha \sin(2\pi f_A t)}{q n_s} + 2\pi f_A \beta B_o \cos(2\pi f_A t) + \frac{1}{2}$$

Equation (5) shows that the offset α and the induced voltage term $2\pi f_A \beta B_o \cos(2\pi f_A t)$ are both at frequency $f_A$. Meanwhile, the signal of interest that is proportional to $B_o$ is at $2f_A$. Using bandpass filters or a lock-in-amplifier, the signal produced at $2f_A$ can be isolated from the induced voltage and the DC offset at $f_A$. The sensitivity of the Hall effect sensor at $2f_A$ is defined as $$\frac{I_o}{2 q n_s}.$$

This technique does not require current spinning or a secondary Hall effect plate to counter the induced magnetic field and the DC offset, and thereby has the potential to reduce the cost and size of the overall device.

B3) Simulation

Figure 2A:
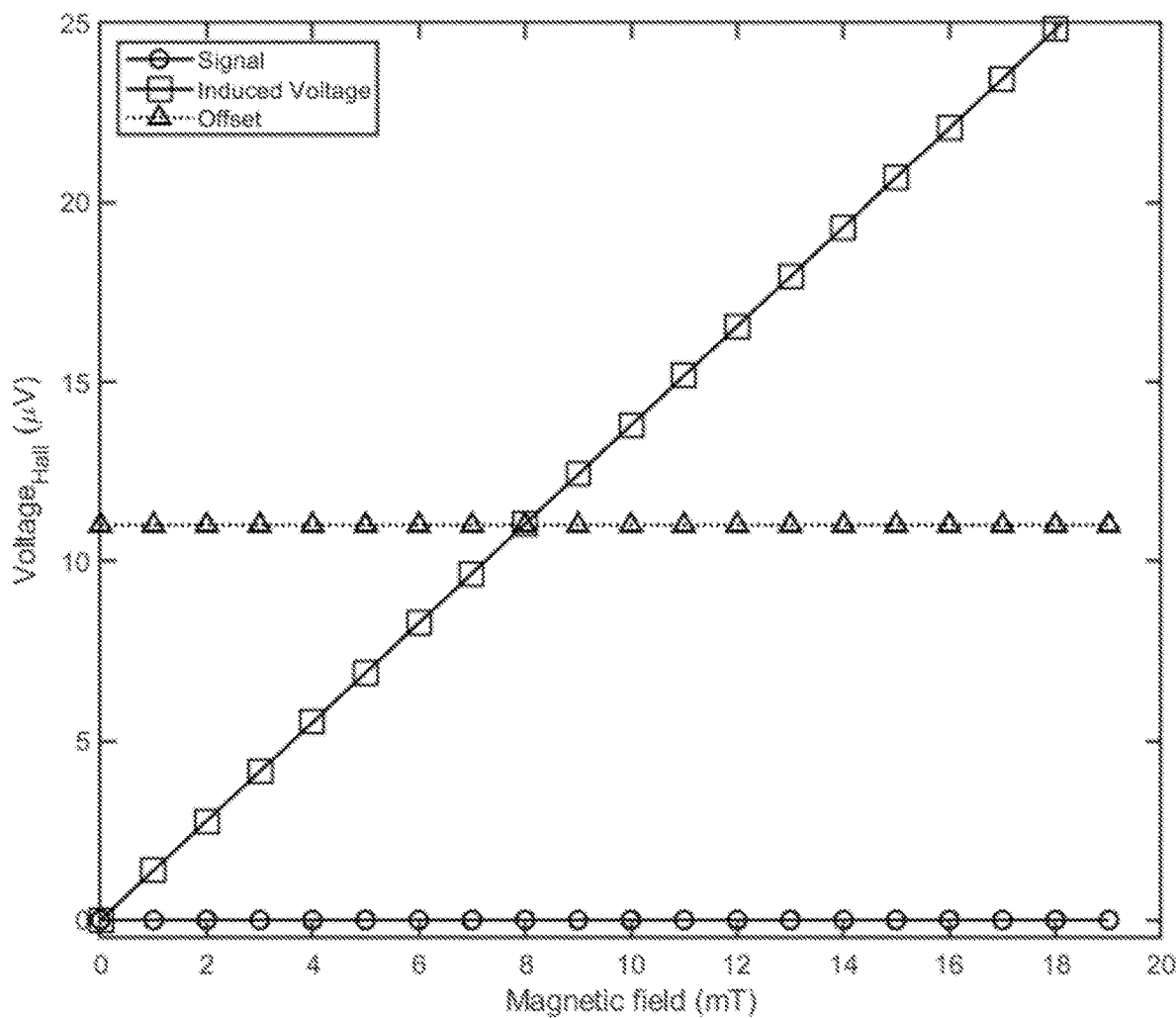
FIGS. 2A-B show exemplary simulated f and 2f Hall, offset and induced signals.
Figure 2B:
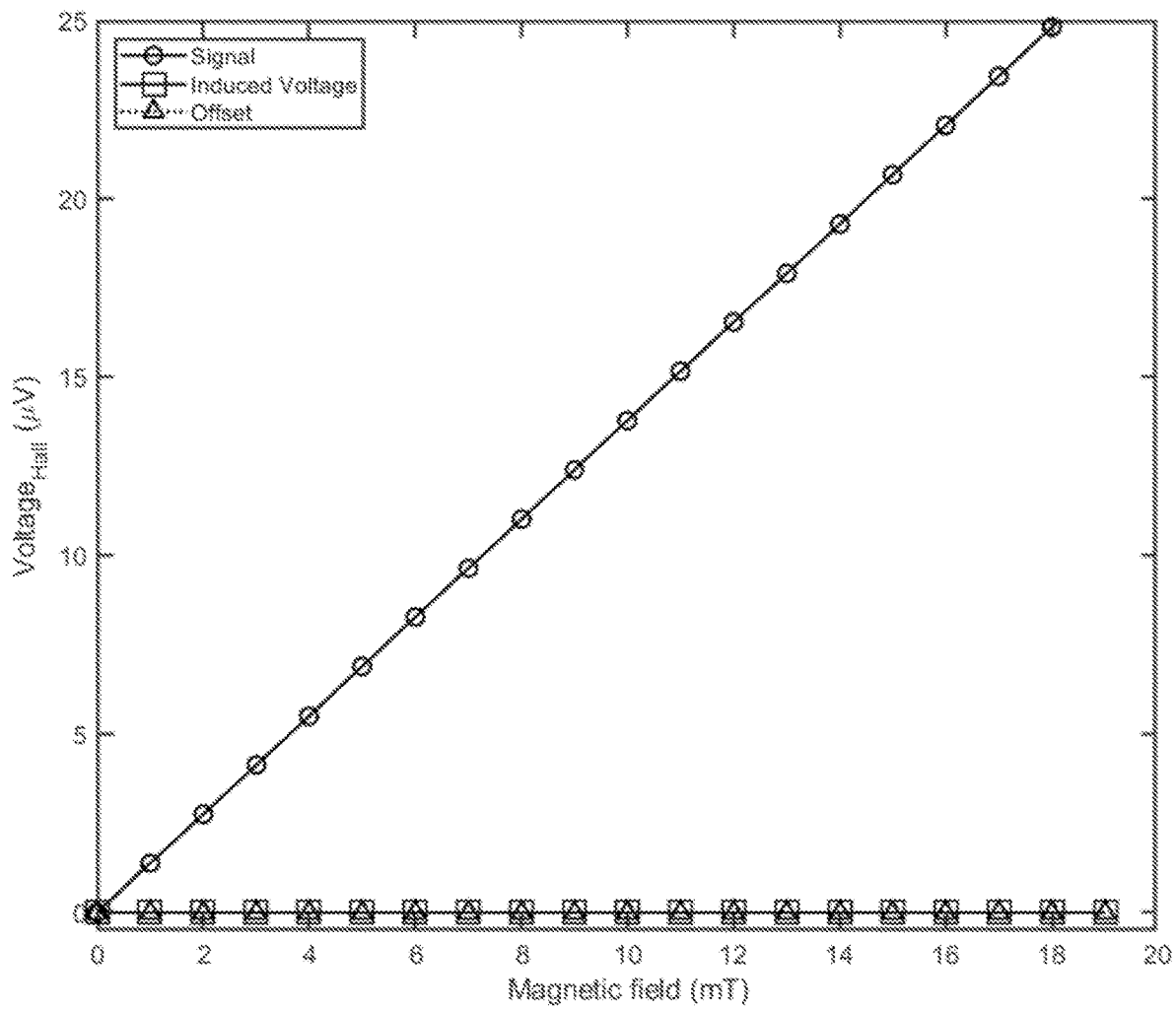

We simulated the 2f technique with an AC magnetic field at a frequency of 500 Hz and an input current also at 500 Hz. The measured signal was deconvoluted using the fast Fourier transform function, and the 2f (1000 Hz) component was isolated from the f (500 Hz) component. The results are displayed in FIGS. 2A-B. Here FIG. 2A shows the signal, induced voltage and offset amplitudes at 500 Hz and FIG. 2B shows these amplitudes at 1000 Hz.

The signal line (circles as data points) is the portion of the Hall voltage (amplitude) due to the external magnetic field $$\frac{-I_o B_o \cos(4\pi f_A t)}{2 q n_s}$$

as $B_o$ is varied. The induced voltage line (squares as data points) is the portion of the Hall voltage due to the induced magnetic field $2\pi f_A \beta B_o \cos(2\pi f_A t)$. The offset line (triangles as data points) is the portion of the Hall voltage due to the offset $$\frac{I_o \alpha \sin(2\pi f_A t)}{q n_s}.$$

The offset, α, was held constant in the simulation at 5.5 μV and the magnitude of the induced voltage, β, was held at 1V*s/mT. Sheet density, $n_s$ was $2.1 \times 10^{13}$ cm$^2$ as measured experimentally for the Hall effect sensor at room temperature.

It is observed that at 2f the Hall voltage increases linearly with an increase in $B_o$ and is not affected by the magnitude of α and β. At f, increasing the external magnetic field has a linear relationship with an increase in induced voltage and a steady constant offset. The summary of the results is shown in Table 1.

Being able to isolate the signal from the offset and induced voltage is a significant advantage over the current state-of-the-art solutions. In practice, the isolation can be achieved using bandpass filters or lock-in detection.

TABLE 1

Summary of the 2f technique

| Measurement Frequency | Useful Hall Signal | Offset (α) | Induced voltage (β) |
|---|---|---|---|
| $f_A$ | 0 | Constant | Increases with $B_o$ |
| $2f_A$ | Increases with $B_o$ | 0 | 0 |

B4) Experiments and Discussion

To generate the AC magnetic field, a Zurich Instruments lock-in amplifier generated a sine wave which was amplified by an AC current amplifier (Bruel & Kjaer). The output of the amplifier was connected to a solenoid that produced the magnetic field. The output of the lock-in amplifier was connected to an AC current amplifier and an InAlN/GaN Hall effect sensor, to maintain phase and frequency. The InAlN/GaN Hall effect sensor is a 4-contact sensor with a 2DEG acting as the conducting layer. The Hall effect sensor was also driven by the same lock-in amplifier at 0.5 V at the same frequency as the magnetic field and the Hall voltage was measured by the lock-in amplifier at 2f. The AC magnetic field was also measured for validation using a commercial gaussmeter (AlphaLab Model GM2) which could measure up to 800 Hz with the probe placed on top of the Hall effect sensor. The experiment was conducted in the presence of Earth's magnetic field.

The external magnetic field strength was varied by using the gain of the current amplifier. The frequency of the magnetic field and input current to the Hall effect sensor were varied using the lock-in amplifier.

Figure 3:
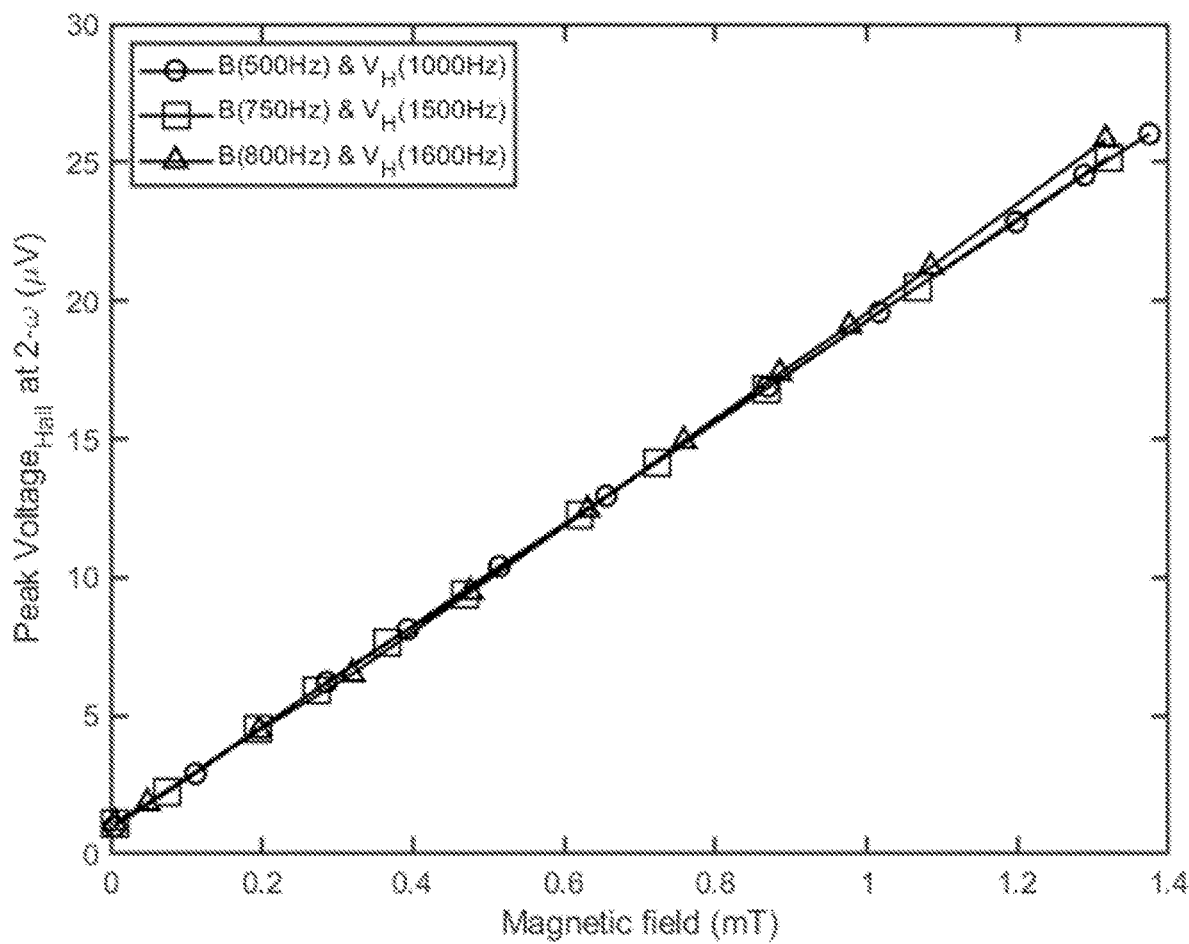
FIG. 3 is a plot of measured useful Hall signal at 2f vs. magnetic field strength for several different frequency conditions.

FIG. 3 shows the relationship between the measured external magnetic field using the commercial gaussmeter and the Hall voltage measured by the lock-in amplifier. The linear relationship obtained demonstrates the validity of the 2f technique. The experiment was conducted at various frequencies between 500 to 800 Hz to further demonstrate that the 2f technique can work across frequencies. The average gradient (sensitivity) of the experimental lines in FIG. 3 is 18.49 mV/T and the theoretical gradient is calculated 19.33 mV/T which is within 5% of the experimental value. The offset measured is between 24-31 µT.

To experimentally compare the magnitude of the induced voltage between the signals measured at f and 2f, the following experiment was performed. The Hall effect sensor was disconnected from the current source ($I_o=0$) and the magnetic field magnitude ($B_o$) was varied at 800 Hz. The output from the Hall effect sensor was measured at 800 Hz (f) and 1600 Hz (2f). The magnetic field was increased and decreased stepwise with 5-second intervals.

With zero input current ($I_o=0$), only the induced magnetic field component, $2\pi f_A \beta B_o \cos(2\pi f_A t)$, is non-zero in the Hall voltage signal. Because the induced voltage component oscillates at frequency $f_A$, we would expect to be able to detect a signal at $f_A$ but not at $2f_A$.

Figure 4:
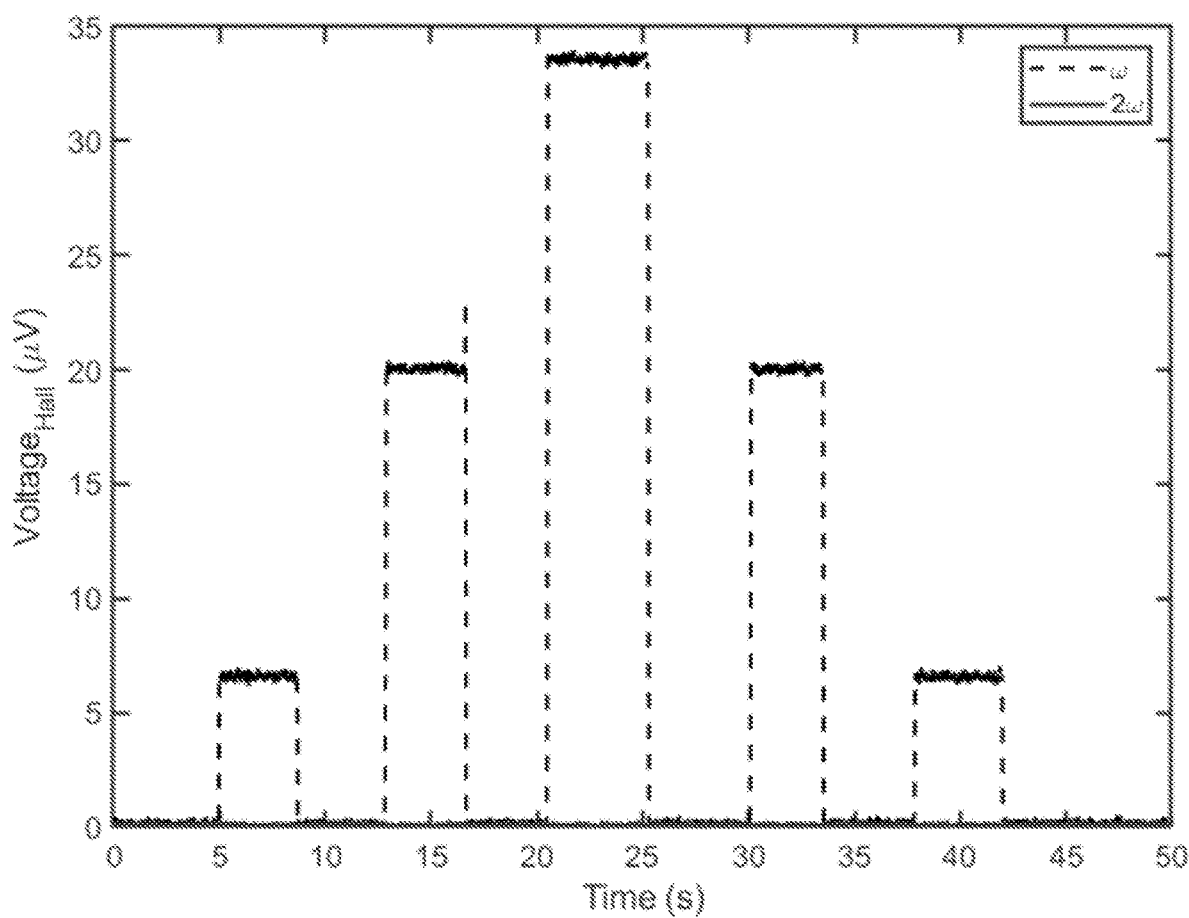
FIG. 4 shows a plot of the f and 2f zero current signals as magnetic field is switched on and off.

FIG. 4 shows that the f signal (dashed line) has a strong response to the change in magnetic fields, whereas the signal at 2f (solid line, indistinguishable from the horizontal axis), has zero response to the change in the magnetic field, as would be expected given the absence of an input current ($I_o=0$). This result verifies that the signal measured at 2f is significantly not affected by voltage due to an induced magnetic field at this frequency, significantly improving the signal-to-noise ratio.

B5) Commercial Implementation

Figure 5:
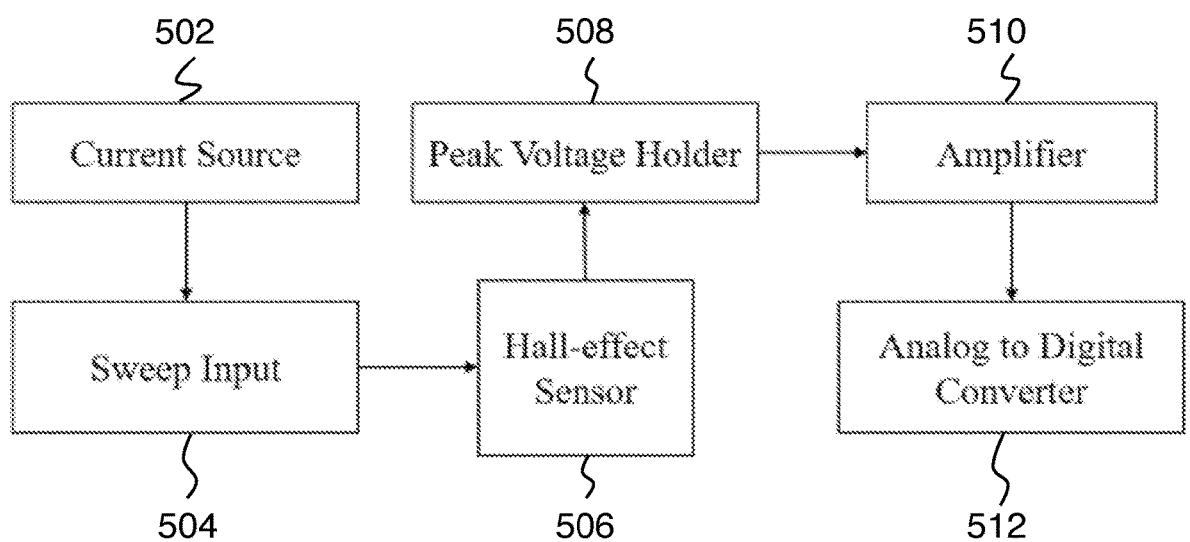
FIG. 5 is an exemplary block diagram of a system for use with a magnetic field of unknown frequency.

FIG. 5 shows an exemplary block diagram for how to integrate the Hall effect sensor with auxiliary components for commercial use of the 2f technique.

Here 502 is a current source, 504 is a sweep input, 506 is a Hall effect sensor, 508 is a peak voltage holder, 510 is an amplifier and 512 is an analog to digital converter (ADC). Here sensor 506 is regarded as including both sensor 102 and narrowband detector 106 of FIG. 1.

In many applications, the frequency of the magnetic field may not be known. Thus, a sweep of various frequencies of the driving current into the Hall effect sensor may be performed. The peak voltage holder could record the peaks both at f and at 2f, thus distinguishing the noise from the signal. The 2f voltage recorded on the peak-holder can be amplified and read using an ADC. A system according to this approach has the potential to be smaller in size and have a lower component count than current methods for measuring AC fields. For example, a dual Hall effect sensor requires two Hall effect sensors. The above layout in FIG. 5 also enables further studies of magnetic field strengths at different frequencies.

B6) Conclusion

We have provided a new technique for operating Hall effect sensors to measure AC magnetic fields that does not rely on the current-spinning method and results in no induced voltage. The new 2f technique has the potential to characterize the frequencies and magnitudes of AC magnetic fields with fewer components and thus lower costs. The technique is not frequency-limited for the frequencies explored, as it does not rely on switching circuitry. The 2f technique may be advantageous in systems with moving parts that generate AC magnetic fields or currents (e.g. turbines, electric motors, transformers).

The invention claimed is:

1. Apparatus for performing a Hall effect measurement of a time-varying magnetic field, the apparatus comprising:
   a Hall effect sensor, wherein the Hall effect sensor provides a first signal proportional to a product of applied current and the time-varying magnetic field, and wherein the Hall effect sensor provides a second signal proportional to the applied current and independent of the time-varying magnetic field;
   an electrical source configured to drive the applied current through the Hall effect sensor, wherein a frequency of the applied current is $f_A$;
   a narrowband electrical detector configured to provide an output Hall effect signal of the apparatus at $2f_A$, wherein the narrowband electrical detector is preferentially responsive at $2f_A$ relative to $f_A$;
   whereby the output Hall effect signal at $2f_A$ of the apparatus has improved magnetic field sensing accuracy due to suppression of the second signal.

2. The apparatus of claim 1,
   wherein the Hall effect sensor provides a third signal proportional to a time derivative of the time-varying magnetic field and independent of the applied current;
   whereby the output Hall effect signal at $2f_A$ has improved magnetic field sensing accuracy due to suppression of the third signal.

3. The apparatus of claim 1, wherein the apparatus is configured to measure a magnetic field in a system selected from the group consisting of: automotive engines, airplane engines, fusion reactors, electrical power plants, electric motors and power electronics.

4. The apparatus of claim 1, wherein the time-varying magnetic field is at a single known frequency $f_B$, and wherein $f_A=f_B$.

5. The apparatus of claim 1, wherein the time-varying magnetic field is at a single unknown frequency, and further comprising:
   a processor configured to sweep $f_A$ within a predetermined frequency range and to automatically identify a frequency value f* of the applied current in the predetermined frequency range having a maximal output Hall effect signal at 2f*;
   whereby the single unknown frequency of the magnetic field is measured to be f*.

6. The apparatus of claim 5, wherein the processor is configured to monitor the frequency value f* for changes in magnetic field frequency.

7. The apparatus of claim 1, wherein the time-varying magnetic field is at two or more unknown frequencies, and further comprising:
   a processor configured to sweep $f_A$ within a predetermined frequency range and to provide an output measured magnetic field spectrum $B(f_A)$ given by the output Hall effect signal at $2f_A$.

8. The apparatus of claim 7, wherein the processor is configured to monitor the output measured magnetic field spectrum $B(f_A)$ for changes in magnetic field frequency.

9. The apparatus of claim 1, further comprising a processor configured to monitor the output Hall effect signal at $2f_A$ of the apparatus for changes in magnetic field strength.

* * * * *